United States Patent [19]

Green et al.

[11] 4,308,367
[45] Dec. 29, 1981

[54] HYDROXYL-CONTAINING COMPOSITIONS AND THEIR POLYMERIZATION

[75] Inventors: George E. Green, Stapleford, England; Abdul-Cader Zahir, Oberwil, Switzerland

[73] Assignee: Ciba-Geigy Corporation, Ardsley, N.Y.

[21] Appl. No.: 4,960

[22] Filed: Jan. 19, 1979

[30] Foreign Application Priority Data

Jan. 20, 1978 [GB] United Kingdom ................ 2597/78

[51] Int. Cl.$^3$ .................... C08G 8/20; C08G 8/22; C08L 63/00; C08L 63/10
[52] U.S. Cl. .................... 525/529; 428/426; 428/436; 428/441; 428/460; 428/461; 428/506; 525/523; 528/152; 528/192; 528/205
[58] Field of Search ............ 528/192, 152, 205; 525/529, 523

[56] References Cited

U.S. PATENT DOCUMENTS

| | | | |
|---|---|---|---|
| 2,662,869 | 12/1953 | Bloch | 528/205 |
| 3,420,915 | 1/1969 | Braithwaite | 528/205 |
| 3,431,239 | 3/1969 | Morris et al. | 528/205 |
| 3,503,930 | 3/1970 | Morris et al. | 528/205 |
| 3,619,393 | 11/1971 | Stahly | 204/159.15 |
| 3,801,676 | 4/1974 | Hickner | 204/158 X |
| 3,968,167 | 7/1976 | Hickner | 528/107 X |
| 4,048,218 | 9/1977 | Morgan et al. | 528/205 |
| 4,126,505 | 11/1978 | Garnish et al. | 525/523 X |
| 4,197,395 | 4/1980 | Lemieux et al. | 528/205 |

*Primary Examiner*—Howard E. Schain

*Attorney, Agent, or Firm*—Joseph F. DiPrima; Luther A. R. Hall

[57] ABSTRACT

Polymerizable compositions comprise
(a) a compound containing in the same molecule both at least one phenolic hydroxyl group and at least two groups chosen from allyl, methallyl, and 1-propenyl groups, e.g., 2,2-bis(3-allyl-4-hydroxyphenyl)propane or bis(3-(1-propenyl)-4-hydroxyphenyl)methane,
(b) a compound containing at least two mercaptan groups per molecule, e.g., pentaerythritol tetrathioglycollate, and
(c) a heat-activated crosslinking agent for phenol-aldehyde novolac resins.

The compositions are caused to polymerize by the action of irradiation of free-radical catalysts. The polymers so obtained, containing more than one phenolic hydroxyl group, can be subsequently crosslinked in situ by heating. The compositions are useful in various two-stage operations, such as the production of multilayer printed circuits.

Polymerizable compositions may also comprise
(d) a compound as (a) but containing at least two phenolic hydroxyl groups,
(e) a compound containing more than two mercaptan groups per molecule.

On irradiation or on heating in the presence of a catalyst, preferably a free-radical catalyst, these compositions crosslink, they are useful as adhesives in forming coatings on polar substrates.

17 Claims, No Drawings

HYDROXYL-CONTAINING COMPOSITIONS AND THEIR POLYMERIZATION

BACKGROUND OF THE INVENTION

This invention relates to compositions containing a polymercaptan and a compound which has both at least two allyl, methallyl, or 1-propenyl groups and at least one phenolic hydroxyl group. It also relates to the polymerisation of such compositions by means of actinic radiation or free-radical catalysts, to the further crosslinking, on heating, of polymerised products, alone or with a heat-curing agent, and to the use of such products as surface coatings, in printing plates, printed circuits, and reinforced composites, and as adhesives.

For a number of reasons it has become desirable to induce polymerisation of synthetic resin compositions by means of actinic radiation. Employing photopolymerisation procedures may, for example, avoid the use of organic solvents with their attendant risks of toxicity, flammability, and pollution, and the cost of recovering the solvent. Photopolymerisation enables insolubilisation of the resin composition to be restricted to define areas, i.e., those which have been irradiated, and so permits the production of printed circuits and printing plates or allows the bonding of substrates to be confined to requires zones. Further, in production processes, irradiation procedures are often more rapid than those involving heating and a consequential cooling process.

We have now found that valuable products can be made by photopolymerisation of compositions containing a polymercaptan and a compound which contains both at least one phenolic hydroxy group and at least two allyl, and/or methallyl, and/or 1-propenyl groups. We have found, too, that such compositions may also be polymerised by means of free-radical catalysts. The composition, comprising polymerised material containing residual phenolic hydroxyl groups, may be further crosslinked, i.e., converted into the insoluble, infusible, C-stage on heating by means of a heat-activated crosslinking agent for phenolaldehyde novolac resins contained therein. Hence, a stepwise cure is possible.

DETAILED DISCLOSURE

One aspect of this invention accordingly provides polymerisable compositions comprising
(a) a compound containing in the same molecule both at least one phenolic hydroxyl group and at least two groups chosen from allyl, methallyl, and 1-propenyl groups.
(b) a compound containing at least two mercaptan groups per molecule, and
(c) a heat-activated crosslinking agent for phenol-aldehyde novolac resins.

Another aspect of this invention is a process for the polymerisation of such compositions, comprising exposing them to actinic radiation or to the effect of a free-radical catalyst.

We have further found that mixtures of a compound having at least two phenolic hydroxyl groups and at least two allyl, methallyl, or 1-propenyl groups with a compound having a mercaptan functionality greater than two can be cured on irradiation or on heating in the presence of a free-radical catalyst to form crosslinking polymeric coatings having excellent adhesion to polar substrates such as metal and glass.

Hence there are also provided polymerisable compositions comprising:
(d) a compound containing in the same molecule both at least two phenolic hydroxyl groups and at least two groups chosen from allyl, methallyl, and 1-propenyl groups, and
(e) a compound having at least three mercaptan groups per molecule, and a process for the polymerization of such compositions, comprising exposing them to actinic radiation or heating them in the presence of a free-radical catalyst.

It is known that compounds containing allyl groups undergo an addition reaction with polymercaptans, which reaction may be initiated by actinic radiation or by free-radical catalyst (see, e.g., British Pat. Nos. 1,215,591, 1,251,232, 1,292,722, 1,445,814, and U.S. Pat. Nos. 3,787,303, 3,877,971, 3,900,954, and 3,908,039). There has been described, for example, such a reaction between compounds containing two, three, or more mercaptan groups and diallyl adipate 2,2-bis(4-allyloxyhenyl)-propane, 2,4,6-tris(allyloxy)-s-triazine, 2,2-bis(4-(3-diallylamino-2-hydroxypropoxy)phenyl)propane, and di-adducts of allyl alcohol, diallyl malate, or trimethylolpropane diallyl ether with toluylene-2, 4- or 2,6-di-isocyanate, 3,3'-dimethyl-4,4'-di-isocyanatodiphenol, 3-isocyanatomethyl-3,5,5-trimethylcyclohexyl isocyanate, or 4,4'-methylenebis(cyclohexyl isocyanate). When the sum of the number of allyl groups per average molecular of the allyl component and of the number of mercaptan groups per average molecule of the polymercaptan is more than 4, crosslinked structures may be formed. Further, Marvel and co-workers (J.Polymer Sci., 1951, 6, 127–143 and ibid, 711–716) have described the reaction of hexane-1,6-dithiol with 2,6-diallylphenol under the influence of ultra-violet light or a free radical catalyst. The resultant polymer, of low intrinsic viscosity, was converted into a crosslinked rubber by mixing it with hexamethylenetetramine and then heating. However, the addition of polymercaptans across the double bonds of allyl, methallyl, or 1-propenyl groups in compounds containing at least one phenolic hydroxyl groups in the presence of a heat-activated crosslinking agent for phenol-aldehyde novolac resins to form products which can be subsequently crosslinked in situ by heating, has not, it is believed, hitherto been described. Neither, it is believed, has the crosslinking of at least dihydric phenols containing two or more allyl, methallyl, or 1-propenyl groups by means of tri- and higher mercaptans been described.

Preferably the component (a) or (d) contains one or more benzene nuclei or one or more naphthalene nuclei as the sole aromatic constituents, and preferably it has a molecular weight of at most 1000. Preferably each allyl, methallyl, or 1-propenyl group is directly attached to an oxygen, nitrogen, or carbon atom, particularly either to a carbon atom which forms part of an aromatic nucleus or to an oxygen atom which in turn is directly attached to a carbon atom which forms part of an aromatic nucleus. Especially preferred as components (a) or (d) are polyhydric phenols, the phenolic hydroxyl groups of which are partially etherified with allyl, methallyl, or 1-propenyl groups, or phenols substituted in the aromatic nucleus or nuclei by allyl, methallyl, or 1-propenyl groups, especially by an allyl, methallyl, or 1-propenyl group ortho to each phenolic hydroxyl group.

The following formulae are those of examples of preferred compounds:

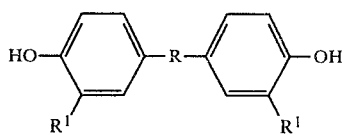

I

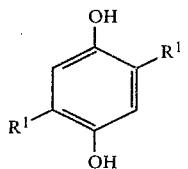

II

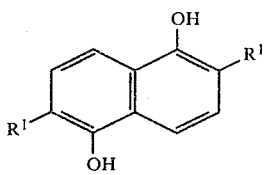

III

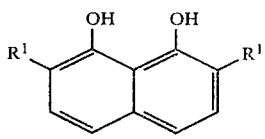

IV

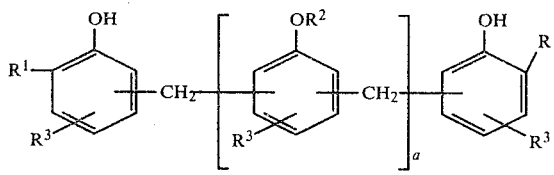

V

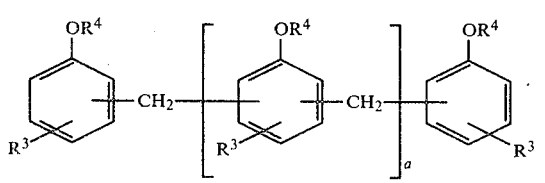

VI

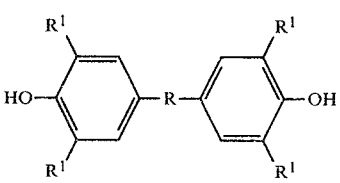

VII and, as a component (a),

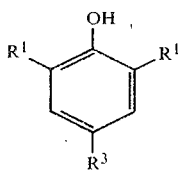

VIII where

R denotes a carbon-carbon bond, an alkylene group of 1 to 5 carbon atoms, an ether oxygen atom, a sulphur atom, or a group of formula —CO—, —SS—, —SO—, or —SO$_2$—, $R^1$ denotes an allyl, methallyl, or 1-propenyl group, a is an integer of at least 1 in the case of component (a) and at least 2 in the case of a component (d), each $R^2$ denotes an allyl or methallyl group, each $R^3$ denotes a hydrogen, chlorine, or bromine atom, or an alkyl group of 1 to 4 carbon atoms, and each $R^4$ denotes an allyl or methallyl group or a hydrogen atom, such that at least two $R^4$ each denote an allyl or methallyl group and in the case of a component (a) at least one $R^4$ denotes a hydrogen atom and in the case of a component (d), at least two $R^4$ each denote a hydrogen atom, with the proviso that, in formulae V and VI, the —CH$_2$— groups shown are ortho- or para- to the indicated groups —OH, —OR$^2$, and —OR$^4$.

Particularly preferred are 2,2-bis(3-allyl-4-hydroxyphenyl)propane, bis(3-allyl-4-hydroxyphenyl)methane, and their 3-(1-propenyl) analogues.

Compounds of formulae I to V are obtainable by conversion of the corresponding unsubstituted phenols, i.e., those of formula IX

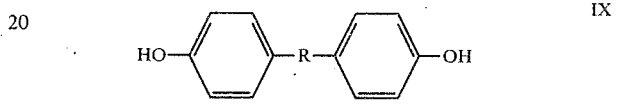

IX hydroquinone, 1,5- or 1,8-dihydroxynaphthalene, and a novolac of formula X

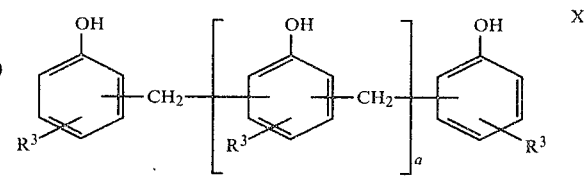

X where R, $R^3$, and a have the meanings previously assigned, and the —CH$_2$— groups shown are ortho- or para- to the indicated —OH groups, into their at least diallyl and dimethallyl ethers, e.g., by means of allyl or methallyl chloride, Claisen rearrangement to the ortho-allylphenol or ortho-methallylphenol, and optionally, isomerisation of the orthoallylphenol into the ortho-1-propenylphenol by heating in the presence of a strong alkali.

Compounds of formula VI are obtainable by partial etherification using, e.g., allyl chloride or methallyl chloride, of residual phenolic hydroxyl groups in novolacs of formula X. Compounds containing two allyl, methallyl, or 1-propenyl groups in the same phenolic nucleus, such as those of formula VII and VIII, are obtainable by etherification with, e.g., allyl chloride or methallyl chloride, of the ortho-allyl or ortho-methallyl phenol, followed by a second Claisen rearrangement and, optionally, isomerisation of allyl groups to 1-propenyl groups through the action of alkali.

There may also be used as component (a) or (d) a product obtained by advancement of a stoichiometric deficit of a diepoxide with a dihydric phenol substituted in the aromatic nucleus or nuclei by at least one allyl, methallyl, or 1-propenyl group, e.g., a phenol of formula I or II. Suitable diepoxides include diglycidyl ethers of dihydric alcohols, diglycidyl esters of dicarboxylic acids, di(N-glycidyl)hydantoins, such as 1,3-diglycidylhydantoin and 3,3'-diglycidyl-1,1'-methylenebis(hydantoin), and diglycidyl ethers of dihydric phenols, e.g., of a dihydric phenol of formula IX. Alternatively, there may be used as component (a) or (d) a product obtained by advancement with a dihydric phenol, a dihydric alcohol, a dicarboxylic acid, or a hydantoin containing two NH groups, of a diepoxide containing at least one allyl, methallyl, or 1-propenyl group, such as the diglycidyl ether of a phenol of formula I.

The advancement of diepoxides is a generally known reaction (see, e.g., H. Batzer and S. A. Zahir, J. Appl. Polymer Sci., 1975, 19, 585–600 and H. Lidarik, Kunststoff Rundschau, 1959, 4, 6–10) and can be used to prepare allyl- methallyl-, and 1-propenyl-containing phenols of the type used in this invention.

A wide range of polymercaptans is suitable for use as component (b) or (e) in the compositions of this invention. Preferably the mercaptans are free from any allyl, methallyl, 1-propenyl, or phenolic hydroxyl group, and preferably they have a molecular weight of not more than 3,000. The polymercaptans employed generally contain not more than six mercaptan groups per molecule.

One class comprises esters of monomercaptancarboxylic acids with polyhydric alcohols or of monomercaptanmonohydric alcohols with polycarboxylic acids.

Further preferred such esters are of the formula

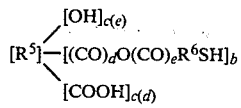

XI where $R^5$ represents an aliphatic or araliphatic hydrocarbon radical of from 2 to 60 carbon atoms, which may contain not more than one ether oxygen atom, $R^6$ represents a hydrocarbon radical, which may contain not more than one carbonyloxy group, and is preferably of from 1 to 4 carbon atoms, b is an integer of from 2 to 6 in the case of a component (b) or of from 3 to 6 in the case of a component (e), c is zero or a positive integer of at most 3, such that (b+c) is at most 6 (terms such as c(d) being construed algebraically), and d and e each represent zero or 1, but are not the same.

Yet further preferred esters are polymercaptans of formula XI which are also of the formula $$R^7(OCOR^8SH)_b \quad \text{XII}$$

where b has the meaning previously assigned, $R^7$ is an aliphatic hydrocarbon radical of from 2 to 10 carbon atoms, and $R^8$ denotes $-CH_2)_2-$, $-(CH_2)_2$, or $-CH(CH_3)-$.

Also preferred are mercaptan-containing esters, including esters of monomercaptandicarboxylic acids, of formula

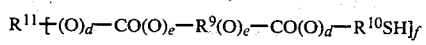 XIII where d and e have the meaning previously assigned, f is an integer of from 1 to 6 in the case of a component (b) or of from 2 to 6 in the case of a component (e), $R^9$ represents a divalent organic radical, linked through a carbon atom or carbon atoms thereof to the indicated —O— or —CO— units, $R^{10}$ represents a divalent organic radical, linked through a carbon atom or carbon atoms thereof to the indicated —SH group and —O— or —CO— unit, and $R^{11}$ represents an organic radical, which must contain at least one —SH group either in the case of a component (b) when f is 1, or in the case of a component (c) when f is 2, linked through a carbon atom or carbon atoms thereof to the indicated adjacent —O— or —CO— unit or units.

Preferably, $R^9$ denotes, when d is zero, a saturated aliphatic unbranched hydrocarbon chain of 2 to 20 carbon atoms, which may be substituted by one or more methyl group and by one or more mercaptan groups and which may be interrupted by one or more ether oxygen atoms and by one or more carbonyloxy groups; when d is 1, $R^9$ preferably denotes (i) a saturated aliphatic hydrocarbon group of 2 to 10 carbon atoms, which may bear a mercaptan group, (ii) a cycloaliphatic-aliphatic hydrocarbon group of 5 to 34 carbon atoms, which may contain one or more ethylenically-unsaturated double bonds, or (iii) a mononuclear arylene hydrocarbon group of 6 to 12 carbon atoms.

$R^{10}$ preferably denotes, when d is zero, a saturated aliphatic hydrocarbon group of 1 to 3 carbon atoms, which may bear a carboxyl group, and, when d is 1, it preferably denotes a saturated aliphatic hydrocarbon group of 2 to 4 carbon atoms, which may be substituted by a hydroxyl group or by a chlorine atom.

$R^{11}$ preferably denotes (iv) an aliphatic or cycloaliphatic-aliphatic hydrocarbon group of 2 to 51 carbon atoms, which may bear at least one mercaptan group, or (v) a mononuclear or dinuclear arylene hydrocarbon group of 6 to 15 carbon atoms, or (vi) a chain of 4 to 20 carbon atoms, interrupted by at least one ether oxygen atom and optionally substituted by at least one mercaptan group, or (vii) a chain of 6 to 50 carbon atoms, interrupted by at least one carbonyloxy group, optionally interrupted by at least one ether oxygen atom, and optionally substituted by at least one mercaptan group.

Also suitable are esters and ethers which are of the general formula

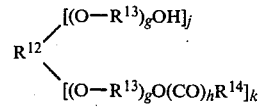 XIV where $R^{12}$ represents a radical of a polyhydric alcohol after removal of (j+k) alcoholic hydroxyl groups, especially an aliphatic hydrocarbon radical of from 2 to 10 carbon atoms, each $R^{13}$ denotes an alkylene group containing a chain of at least 2 and at most 6 carbon atoms between consecutive oxygen atoms, g is a positive integer, preferably such that the average molecular weight of the polymercaptan is not more than 2,000, h is zero or 1, j is zero or a positive integer such that (j+k) is at most 6, k is an integer of from 2 to 6 in the case of a component (b) and an integer of from 3 to 6 in the case of component (e), and $R^{14}$ represents an aliphatic radical of 1 to 6 carbon atoms containing at least one mercaptan group.

The groups $R^{13}$ in individual poly(oxyalkylene) chains may be the same or different and they may be substituted by, e.g., phenyl or chloromethyl groups. Preferably they are —$C_2H_4$— or —$C_3H_6$— groups.

Preferred amongst the compounds of formula XIV are the esters of formula $$R^7 \diagdown^{[(O-R^{13})_gOH]_j}_{[(O-R^{13})_gOCOC_mH_{2m}SH]_k} \quad XV$$

and ethers of formula $$R^7 \diagdown^{[(O-R^{13})_gOH]_j}_{\left[(O-R^{13})_gOCH_2\underset{OH}{CH}CH_2SH\right]_k} \quad XVI$$

where $R^7$, $R^{13}$, g, j, and k have the meanings previously assigned and m is 1 or 2.

Yet other polymercaptans, suitable as component (b), are mercaptan-terminated sulphides of the general formula $$HS\text{-}\left[R^{15}(O)_p\text{-}\left[\underset{R^{16}}{CHO}\right]_q\text{-}R_r^{15}SS\right]_n\text{-}R^{15}(O)_p\text{-}\left[\underset{R^{16}}{CHO}\right]_q\text{-}R_r^{15}SH \quad XVII$$

where each $R^{15}$ denotes an alkylene hydrocarbon group containing from 2 to 4 carbon atoms, $R^{16}$ denotes —H, —$CH_3$, or —$C_2H_5$, n is an integer which has an average value of at least 1, and is preferably such that the average molecular weight of the sulphide is at most 1000, and either p is zero, in which case q and r are each also zero, or p is 1, in which case q is zero or 1 and r is 1.

The preferred sulphides of formula XVII are those where $R^{16}$ denotes hydrogen and p and q are each 1, n being such that the molecular weight of the sulphide is from 500 to 800.

Another class of polymercaptans suitable as component (b) comprises mercaptan-terminated poly(butadienes) of the formula $$HS\text{-}\left[\left[CH_2\text{-}\overset{H}{\underset{|}{C}}=\overset{R^{17}}{\underset{|}{C}}\text{-}CH_2\right]_t\left[CH_2\overset{R^{17}}{\underset{R^{18}}{C}}\right]_u\right]_s\text{-}SH \quad XVIII$$

where each $R^{17}$ represents —H or —$CH_3$, $R^{18}$ represents —CN, —COOH, —$CONH_2$, —$COOR^{19}$, —$C_6H_5$, or —$OCOR^{19}$, where $R^{19}$ is an alkyl group of one to eight carbon atoms, t is an integer of at least one, u is zero or a positive integer, and s is an integer of more than one, preferably such that the average number molecular weight of the polymercaptan is not more than 1000.

Preferably the polymercaptans of formula XVIII are also of the formula $$HS\text{-}\left[\left[CH_2CH\text{=}CHCH_2\right]_w\left[\underset{CN}{CH_2CH}\right]_v\right]_s\text{-}SH \quad XIX$$

where v is either zero, in which case w is 1, or it is 1, in which case w is an integer of from 2 to 5, and s has the meaning previously assigned.

Yet another suitable class of polymercaptan for use as component (b) comprises the mercaptan-terminated oxyalkylene compounds of the general formula $$HS\text{-}\left[\underset{R^{17}}{CHCH_2O}\right]_x\text{-}\underset{R^{17}}{CHCH_2SH} \quad XX$$

where each $R^{17}$ has the meaning previously assigned and x is an integer of from 1 to 4.

A still further class comprises poly(thioglycollates) and poly(mercaptopropionates) of tris(2-hydroxyethyl) isocyanurate and tris(2-hydroxypropyl) isocyanurate, i.e., the compounds of formula $$\begin{array}{c} R^{17} \\ | \\ NCH_2CHOCOR^8SH \\ CO \diagup \quad \diagdown CO \\ R^{20}OCHCH_2N \quad \quad NCH_2CHOCOR^8SH \\ | \quad \diagdown CO \diagup \quad | \\ R^{17} \quad \quad \quad R^{17} \end{array} \quad XXI$$

where each $R^8$ and $R^{17}$ have the meanings previously assigned and $R^{20}$ denotes a group —$COR^8SH$ or, in the case of a component (b), may alternatively represent a hydrogen atom.

Particularly preferred polymercaptans are poly(thioglycollates) and poly(2- or 3-mercaptopropionates) of aliphatic polyhydric alcohols of 2 to 6 carbon atoms.

The proportion of component (a) to component (b) in the present compositions may vary within wide limits but preferably is such that (a) provides a total of from 0.4 to 2.4, and especially 0.8 to 1.2, equivalents selected from allyl, methallyl, and 1-propenyl groups equivalents per mercaptan group equivalent in (b). The proportions of component (d) to component (e) may likewise vary within wide limits but is preferably such that (d) provides a total of from 0.4 to 2.4, especially 0.8 to 1.2, allyl and/or methallyl and/or 1-propenyl group equivalents per mercaptan group equivalent in component (e).

In photopolymerising the compositions of this invention, actinic radiation of wavelength 200-600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of the photopolymerisable composition will depend upon a variety of factors which include, for example, the individual compounds used, the type of light source, and its distance from the irradiated composition. Suitable times may be readily determined by those familiar with photopolymerisation techniques, but when it is required that the products after photopolymerisation remain further crosslinkable by heating, i.e., when a composition containing components (a), (b), and (c) is employed, polymerisation is carried out at a temperature below that at which thermal crosslinking through the phenolic hydroxyl groups becomes substantial.

Preferably, for photopolymerisation, the composition contains a photoinitiator, i.e., a catalyst which, on irradiation, gives an excited state that leads to formation of free radicals which then initiate polymerisation of the composition. Examples of suitable photoinitiators are organic peroxides and hydroperoxides, α-halogen substituted acetophenones such as trichloromethyl 4'-tert-.butylphenyl ketone, benzoin and its alkyl ethers (e.g., the n-butyl ether), α-methylbenzoin, benzophenones such as benzophenone itself and 4,4'-bis(dimethylamino)benzophenone, O-alkoxycarbonyl derivatives of an oxime of benzil or of 1-phenylpropane-1,2-dione, such as benzil (O-ethoxycarbonyl)-α-monoxime and 1-phenylpropane-1,2-dione-2-(O-ethoxycarbonyl)oxime, benzil acetals, e.g., its dimethyl acetal, substituted thioxanthones, e.g., 2-chlorothioxanthone, anthraquinones, and photoredox systems comprising a mixture of a phenothiazine dye (e.g., methylene blue) or a quinoxaline (e.g., a metal salt of 2-(m- or p-methoxyphenyl)quinoxaline-6'or 7'-sulphonic acid) with an electron donor such as benzenesulphinic acid, or other sulphinic acid or a salt thereof such as the sodium salt, or an arsine, a phosphine, or thiourea.

Suitable photoinitiators are readily found by routine experimentation. It is preferred that they do not give rise to a substantial degree of photoinducted polymerisation through consumption of phenolic hydroxyl groups, neither should any other substance present; it is further preferred that when a composition containing components (a), (b), and (c) is employed, they do not cause crosslinking of the photopolymerisable composition such that it does not remain substantially thermosettable.

Generally, 0.05 to 10%, and preferably 0.5 to 5%, by weight of the photoinitiator is incorporated, based on the combined weights of the components (a) and (b) or (d) and (e).

The term "free-radical catalyst" is used herein to refer to substances and does not include actinic radiation. Suitable free-radical catalysts for the polymerisation of the compositions of this invention include 2,2'-azobis(2-methylpropionitrile) and organic or inorganic peroxides, e.g., peracids and their salts and esters, such as peracetic acid, perbenzoic acid, perphthalic acid, di-isopropyl peroxydicarbonate, ammonium or an alkali metal perborate, ammonium or an alkali metal persulphate, acyl peroxides such as benzoyl peroxide, and also, e.g., cumyl peroxide, cumene hydroperoxide, hydrogen peroxide, cyclohexanone peroxide, and ethyl methyl ketone peroxide. A tertiary amine, e.g., dimethylaniline, or a cobalt siccative, e.g., cobalt naphthenate, may be used as an accelerator with the peroxides.

The amount of free-radical catalyst, together with any accelerator therefor, is usually from 0.05 to 5%, and preferably 0.1 to 1%, by weight, calculated on the total of the weights of the components (a) and (b), or (d) and (e).

Standard methods of free radical catalyst-induced polymerisation can be employed; generally, it is necessary to apply heat, although if complete curing is not required, i.e., all the phenolic hydroxyl groups are not to be consumed, or all reactive sites are not to be occupied, because some further operation is intended, the maximum temperature to which the composition is subjected is limited accordingly.

As already indicated, after the composition comprising components (a), (b), and (c) has been polymerised, it may be further crosslinked by virtue of the phenolic hydroxyl groups present.

Another aspect of this invention therefore comprises a process for curing a polymerised composition comprising components (a), (b), and (c) of this invention which comprises heating it.

Preferred heat-activated crosslinking agents (c) include epoxide resins, the epoxide groups of which react with the phenolic hydroxyl groups.

In the usual methods of manufacturing epoxide resins, mixtures of compounds of differing molecular weight are obtained, these mixtures ordinarily containing a proportion of compounds whose epoxide groups have undergone partial hydrolysis. The average number of 1,2-epoxide groups per molecule of the resin need not be an integer of at least 2; it is generally a fractional number but must in any case be greater than 1.0.

Examples of resins which may be used are polyglycidyl and poly(β-methyglycidyl) esters obtainable by reaction of a substance containing two or more carboxylic acid groups with epichlorohydrin, glycerol dichlorohydrin, or β-methylepichlorohydrin in the presence of an alkali. Such esters may be derived from aliphatic carboxylic acids, e.g., oxalic acid, succinic acid, adipic acid, sebacic acid, and dimerised and trimerised linoleic acid, from cycloaliphatic carboxylic acids such as hexahydrophthalic acid, 4-methylhexahydrophthalic acid, tetrahydrophthalic acid, and 4-methyltetrahydrophthalic acid, and from aromatic carboxylic acids such as phthalic acid, isophthalic acid, and terephthalic acid.

Other epoxide resins which may be used include polyglycidyl and poly(β-methylglycidyl) ethers, such as those obtainable by reaction of a substance containing at least two alcoholic hydroxyl groups or at least two phenolic hydroxyl groups with the appropriate epichlorohydrin or glycerol dichlorohydrin under alkaline conditions or, alternatively, in the presence of an acidic catalyst with subsequent treatment with alkali. Such ethers may be derived from aliphatic alcohols, for example, ethylene glycol, diethylene glycol, triethylene glycol, and higher poly(oxyethylene) glycols, propylene glycol and poly(oxypropylene) glycols, propane-1,3-diol, butane-1,4-diol, pentane-1,5-diol, hexane-1,6-diol, hexane-1,2,6-triol, glycerol, 1,1,1-trimethylolpropane, and pentaerythritol; from cycloaliphatic alcohols such as quinitol, 1,1-bis(hydroxymethyl)cyclohex-3-ene, bis(4-hydroxycyclohexyl)methane, and 2,2-bis(4-hydroxycyclohexyl)propane; and from alcohols containing aromatic nuclei, such as N,N-bis(2-hydroxyethyl)aniline and 4,4-bis(2-hydroxyethylamino)diphenylmethane. Preferably the ethers are polyglycidyl ethers of an at least dihydric phenol, for example, resorcinol, catechol, hydroquinone, bis(4-hydroxyphenyl)methane, 1,1,2,2-tetrakis(4-hydroxyphenyl)ethane, 4,4'-dihydroxydiphenyl, bis(4-hydroxyphenyl) sulphone, and phenol-formaldehyde, alkylphenol-formaldehyde, and chlorophenolformaldehyde novolak resins, 2,2-bis(4-hydroxyphenyl)propane (otherwise known as bisphenol A), and 2,2-bis(3,5-dibromo-4-hydroxyphenyl)propane.

There may further be employed poly(N-glycidyl) and poly(N-$\beta$-methylglycidyl) compounds, for example, those obtained by dehydrochlorination of the reaction products of epichlorohydrin and amines containing at least two hydrogen atoms directly attached to nitrogen, such as aniline, n-butylamine, bis(4-aminophenyl)methane, bis(4-aminophenyl) sulphone, and bis(4-methylaminophenyl)methane. Other poly(N-glycidyl) compounds that may be used include triglycidyl isocyanurate, N,N'-diglycidyl derivatives of cyclic alkylene ureas such as ethyleneurea and 1,3-propyleneurea, and N,N'-diglycidyl derivatives of hydantoins such as 5,5-dimethylhydantoin.

Other polyepoxides which may be used include bis(2,3-epoxycyclopentyl) ether, 2,3-epoxycyclopentyl glycidyl ether, and 1,2-bis(2',3'-epoxycyclopentyloxy)ethane.

Especially suitable epoxide resins are polyglycidyl ethers of 2,2-bis(4-hydroxyphenyl)propane, bis(4-hydroxyphenyl)methane, or of a novolac from phenol (which maybe substituted in the ring by chlorine or a hydrocarbon alkyl group of from 1 to 4 carbon atoms) and formaldehyde, having an epoxide content of at least 1.0 epoxide equivalent per kilogram.

Also suitable as component (c) are sources of formaldehyde; by means of these, crosslinking is induced by the formation of methylene or methylene ether bridges, at vacant sites ortho or para to a phenolic hydroxyl group, in between the aromatic nuclei of the addition products formed from the unsaturated phenol (a) and the polymercaptan (b). Typical such sources of formaldehyde are hexamethylenetetramine and paraform.

The compositions of this invention comprising components (a), (b), and (c) may be used as surface coatings. They may be applied to a substrate such as steel, aluminium, copper, cadmium, zinc, tin, glass, ceramic, paper, or wood, preferably as a liquid, and polymerised, and they are then heated to cure them. By polymerising through irradiation part of the coating, as through a mask, those sections which have not been exposed may be washed with a solvent to remove the unpolymerised portions while leaving the photopolymerised, insoluble sections in place. Thus the compositions of this invention may be used in the production of printing plates and printed circuits. Methods of producing printing plates and printed circuits from photopolymerisable compositions are well known (see, e.g., our British patent Specification No. 1 495 746).

The photopolymerised products obtained from compositions containing components (a), (b), and (c) are particularly useful in the production of multilayer printed circuits.

Conventionally, a multilayer printed circuit is prepared from a number of double-sided printed circuit boards of copper, stacked one on top of another and separated from each other by insulating sheets, usually of glass fibre impregnated with a phenol-formaldehyde resin or an epoxide resin in the B-stage. The stack is heated and compressed to bond the layers together. Photopolymerisable materials commonly available hitherto, however, do not form strong bonds either with copper or with resin-impregnated glass fibre sheets. A stack which is bonded with the photopolymer still covering the copper is therefore inherently weak and in use can become delaminated. It is therefore normal practice to remove the residual photopolymer after the etching stage, either by means of powerful solvents or by a mechanical method, e.g., by means of brushes. Such a stripping process can damage the copper of the printed circuits or the surface of the laminate on which the circuit rests, and so there is a need for a method which would avoid the necessity of removing the photopolymerised material prior to bonding the boards together. The presence of phenolic hydroxyl groups in the polymerised compositions of this invention means that crosslinking can occur when the boards are bonded, resulting in good adhesion to the copper and to the resin-impregnated glass fibre substrate, so avoiding the necessity just referred to; also, products with a higher glass transition temperature are obtained.

The compositions comprising components (a), (b), and (c) may also be used as adhesives. Employing irradiation to induce polymerisation, a layer of the composition may be sandwiched between two surfaces of objects, at least one of which is transparent to the actinic radiation, e.g., of glass, then the assembly is heated. Or a layer of the composition in liquid form may be irradiated until it solidifies, producing a film adhesive which is then placed between, and in contact with, the two surfaces which are to be bonded, and is heated to complete crosslinking of the composition. The film may be provided with a strippable backing sheet, e.g., of a polyolefin or a polyester, or of cellulosic paper having a coating of a silicone release agent on one face. Manipulation of the assembly is often easier if the film has a tacky surface. This may be produced by coating the film with a substance which is tacky at room temperature but which is crosslinked to a hard, insoluble, infusible resin under the conditions of heat employed to effect crosslinking of the compositions by means of the phenolic hydroxyl groups. However, an adequate degree of tackiness often exists without additional treatment, especially if polymerisation of the compositon has not proceeded too far. Suitable adherends include metals such as iron, zinc, copper, nickel, and aluminium, ceramics, glass, and rubbers. When free-radical catalysts are used to initiate polymerisation, a layer of the composition containing such a catalyst may be placed between, and in contact with, two surfaces to be joined, and the assembly is heated. Alternatively, a film adhesive may be made, but the amount of heat applied must, of course, be carefully controlled so that the film adhesive is still thermally curable when it is subsequently employed to bond surfaces together.

The compositions containing components (a), (b), and (c) are also useful in the production of fibre-reinforced composites, including sheet moulding compounds. They may be applied directly, in liquid form, to reinforcing fibres (including strands, filaments, and whiskers), which may be in the form of woven or nonwoven cloth, unidirectional lengths, or chopped strands, especially glass, boron, stainless steel, tungsten, alumina, silicon carbide, asbestos, potassium titanate whiskers, an aromatic polyamide such as poly(m-phenylene isophthalamide), poly(p-phenylene terephthalamide) or poly(p-benzamide), polyethylene, or carbon.

It is not necessary to convert immediately a polymerised composition, made from components (a), (b), and (c), distributed on the fibres into the fully crosslinked, insoluble, and infusible C-stage; often it can be changed into the still fusible B-stage, or remain in the A-stage, and, when desired, e.g., after stacking to form a multilayer laminate, and/or after the impregnated material has been formed into some desired configuration, fully crosslinked by heating (or further heating). For example, if a hollow shaped article is required, it is convenient to impregnate a continuous tow of fibrous reinforcement and wind the tow around a romer while, at the same time, exposing the winding to actinic radiation. Such windings still have a certain degree of flexibility, permitting the former to be removed more easily than when a rigid winding is formed in one step. When required, the so-called filament winding is heated to crosslink the composition and complete the cure.

Alternatively, the composition comprising components (a), (b), and (c) may be made into a film adhesive as above, this film is applied to a layer of reinforcing fibres, and then the components of the film are caused to flow about the fibrous material by the application of heat and/or pressure.

This latter procedure is particularly convenient when unidirectional fibrous reinforcement is to be used, especially if the fibres are short and/or light, because there is less tendency for the fibres to become displaced and the reinforcing effect thereby become irregularly distributed.

For applying heat and pressure, heated platens or pairs of rollers may be used for example, and in the latter case, when unidirectional fibres are used, a rolling pressure may be applied in the direction in which the fibres are aligned. In place of pairs of rollers, the assembly may be passed under tension around the periphery of a single roller.

The fibre-reinforced composite may be made by a batch process, the fibrous reinforcing material being laid on the film of the polymerised composition, which is advantageously under slight tension, when a second such film may, if desired, be laid on top, and then the assembly is pressed while being heated. It may also be made continuously, such as by containing the fibrous reinforcing material with the film of the polymerised composition, then, if desired, placing a second such film on the reverse face of the fibrous reinforcing material and applying heat and pressure. More conveniently, two such films, preferably supported on the reverse side belts or strippable sheets, are applied simultaneously to the fibrous reinforcing material so as to contact each exposed face. When two such films are applied, they may be the same or different.

Multilayer composites may be made by heating under pressure interleaved films and layers of one or more fibrous reinforcing materials. When unidirectional fibres are used as the reinforcement material, successive layers of them may be oriented to form crossply structures.

With the fibrous reinforcing material there may be used additional types of reinforcement such as a foil of a metal (e.g., aluminium, steel, or titanium) or a sheet of a plastics material (e.g., an aromatic or aliphatic polyamide, a polyimide, a polysulphone, or a polycarbonate) or of a rubber (e.g., a neoprene or acrylonitrile rubber).

In the production of sheet moulding compounds, a composition of this invention comprising components (a), (b), and (c), and, if used, the photoinitiator, together with the chopped strand reinforcing material and any other components, are exposed to irradiation in layers through supporting sheets. Alternatively, a free-radical catalyst may be employed, avoiding the use of a degree of heat that would cause thermal crosslinking until required.

The polymerisable composition and, if used, the photoinitiator or the free-radical catalyst, are preferably applied so that the composite contains a total of from 20 to 80% by weight of the said components and, correspondingly, 80 to 20% by weight of the reinforcement. More preferably, a total of 30 to 50% by weight of these components and 70 to 50% by weight of the reinforcement are employed.

The compositions of this invention comprising component (a), (b), and (c) are also useful in the production of putties and fillers, and as dip-coating compositions, an article to be coated being dipped in a liquid composition of this invention and withdrawn, irradiated so that the adhering coating solidifies, and then is heated to complete the cure. Alternatively, the composition may be caused to solidify by activating a free-radical catalyst.

Compositions containing components (d) and (e) are, as already indicated, useful for forming crosslinked coatings which usually have excellent adhesion to polar substrates such as metals, glass, and ceramics.

The three component compositions may be supplied as two packs, one containing the unsaturated phenol (a) and the other the polymercaptan (b), the crosslinking agent (c) being contained in either or both packs. Of course, they may also be in the form of three component packs, one containing the phenol (a), a second the polymercaptan (b), and the third the crosslinking agent (c). When the two component compositions, i.e., those containing an at least dihydric phenol (d) and an at least trimercaptan (e), are required, these may likewise be marketed in two component packs, one containing component (d) and one containing component (e). Otherwise, the compositions may be stored as mixtures until required, protected from actinic radiation and sources of free radicals.

The following Examples illustrate the invention. Parts are by weight and temperatures are in degrees Celsius.

Flexural strengths are the mean of three results and were determined according to British Standard No. 2782, Method 304B. Lap shear strengths are also the mean of three results, and were determined according to the British Ministry of Aviation, Aircraft Specification DTD 5577, of November 1965.

2,2-Bis(3-allyl-4-hydroxyphenyl)propane, used in the Examples was prepared in the following manner.

2,2-Bis(4-hydroxyphenyl)propane (228 g), sodium hydroxide (82.5 g), and n-propanol (1 liter) were heated under reflux, and when all was in solution, allyl chloride (200 ml) was added slowly. After 3 hours the mixture was practically neutral. It was stirred under reflux for a further 3 hours, the precipitated sodium chloride was filtered off, and the n-propanol was removed by distillation. The crude 2,2-bis(4-allyloxyphenyl)propane was taken up in methylene chloride, washed with water and, after separation of the aqueous phase, the methylene chloride was distilled off and the pure diallyl ether remaining was dried over sodium sulphate.

To convert the diallyl ether into the desired diallyl-bisphenol it was heated, as an approximately 50% solution in diethylene glycol monoethyl ether, at 200°–205°. The product was purified by heating it in a rotary evaporator and then by vacuum distillation (b.p. 190°/0.5 mm). Microanalysis, gas chromatography, gel permeation chromatography, and NMR and IR-spectroscopy were used to confirm the structure of the intermediary diallyl ether and the rearranged product.

Bis(3'-allyl-4-hydroxyphenyl)methane and 3,3'-diallyl-4,4'-dihydroxydiphenyl can be prepared in the same way, from bis(4-hydroxyphenyl)methane and 4,4'-dihydroxydiphenyl, respectively.

2,2-Bis(3-(1-propenyl)-4-hydroxyphenyl)propane was prepared as follows:

2,2-Bis(3-allyl-4-hydroxyphenyl)propane (1 mole) was mixed with potassium hydroxide pellets (2.2 moles) and the mixture was stirred and heated at 110° for 30 minutes. The mixture was cooled, neutralised with dilute hydrochloric acid, and the product was extracted to give methylene chloride. The solution was dried and evaporated to give substantially pure 2,2-bis(3-(1-propenyl)-4-hydroxyphenyl)propane.

Proton NMR and IR-spectroscopy were used to confirm the assigned structure. More detailed studies using $^{13}$C NMR, however, showed the presence of minor amounts of isomeric material such as 2-(3-(1-isopropenyl)-4-hydroxyphenyl)-2-(3-(1-isopropenyl)-2-hydroxyphenyl)propane, believed to be formed by thermal scission and recombination of the product.

2,2-Bis(3,5-diallyl-4-hydroxyphenyl)propane was prepared by conversion of 2,2-bis(3-allyl-4-hydroxyphenyl)propane into its diallyl ether and subjecting this to a Claisen rearrangement as described above. Its allyl double bond content was 10.3 equiv./kg.

Rearrangement of 1,3-diallyloxybenzene afforded a mixture of the two isomeric phenols, 1,3-diallyl-2,4-dihydroxybenzene and 1,5-diallyl-2,4-dihydroxybenzene. The mixture had an allylic double bond content of 10.53 equiv./kg.

Bis(3-allyl-4-hydroxyphenyl) sulphone was prepared by rearrangement of bis(4-allyloxyphenyl) sulphone; its allylic double bond content was 6.71 equiv./kg.

The polymercaptans employed were commercially-available materials, having the following thiol contents:

| Polymercaptan | SH-Equiv./kg |
|---|---|
| Ethylene glycol dithioglycollate | 9.05 |
| Trimethylolpropane trithioglycollate | 8.0 |
| Pentaerythritol tetrathioglycollate | 8.8 |
| Tris(3-mercapto-2-hydroxypropyl ether) of a poly(oxypropylene)triol of average molecular weight 800 | 3.6 |
| Dipentaerythritol hexakis(3-mercaptopropionate) | 7.3 |
| A polysulphide of formula XXII, below | 2.0 |

EXAMPLE 1

Hexamine (5 parts) was dissolved in a mixture, warmed to 40°, of ethylene glycol dithioglycollate (68 parts), 2,2-bis(3-allyl-4-hydroxyphenyl)propane (100 parts, i.e., 1 allyl group equivalent per mercaptan group), and benzil dimethyl acetal (4 parts). Glasscloth (plain weave, weighing 200 g/m², with an epoxysilane finish) was impregnated at room temperature with this composition and then it was exposed on both sides for 1 minute, at a distance of 18 cm, to a 400 w high pressure metal halide-quartz arc lamp radiating predominantly in the 365 nm waveband. A tack-free prepreg was obtained.

Six 10-cm square pieces of the prepreg were stacked and heated at 180° for 1 hour under an applied pressure of 0.69 MN/m², allowing a dwell time of 3 minutes before applying maximum pressure. The laminate was further heated at 180° for 1 hour without applied pressure. It had a flexural strength of 265 MN/m², and was composed of 57.2% of glass.

EXAMPLE 2

A liquid composition was prepared by stirring 2,2-bis(3-allyl-4-hydroxyphenyl)propane (100 parts), trimethylolpropane trithioglycollate (81 parts, i.e., 1 allyl group equivalent per mercaptan group), benzil dimethyl acetal (4 parts), a polyglycidyl ether of a phenolformaldehyde novolac, having an epoxide content of 5.6 equiv./kg, the molar ratio of phenol to formaldehyde in the novolac being 1:0.72 (115 parts), and 2-phenylimidazole (2 parts). This composition was coated onto a polyamide carrier film at room temperature and converted into a tack-free film by irradiation on both sides for 30 seconds with a 400 w high pressure metal halide-quartz lamp at a distance of 18 cm.

The film adhesive so obtained was cut to size and sandwiched between two sheets of "Alclad 3L 73" aluminium alloy that had been degreased in trichloroethylene and pickled in chromic acid solution ("Alclad" is a registered Trade Mark). Overlap joints of 1.27 cm were prepared by pressing the assembly under a pressure of 0.34 MN/m² for 1 hour at 180°. The lap shear strength of the joints was 6.4 MN/m².

EXAMPLE 3

The procedure of Example 2 was repeated except that there was used 115 parts of trimethylolpropane trithioglycollate, i.e., 0.7 allyl group equivalent per mercaptan group. The lap shear strength of the joints was 5 MN/m².

EXAMPLE 4

A surface coating was prepared by applying a mixture comprising 100 parts of 2,2-bis(3-allyl-4-hydroxyphenyl)propane, 74 parts of pentaerythritol tetrathioglycollate, i.e., 1 allyl group equivalent per mercaptan group, 5 parts of hexamethylenetetramine, and 4 parts of 2,2'-azobis(2-methylpropionitrile) as a layer 4 μm thick on degreased and pickled aluminium sheets and heating for 1 hour at 80° and then for one hour at 180°. The coating was non-tacky, and was not affected by 20 rubs with an acetone-soaked cotton wool swab.

EXAMPLE 5

A mixture was prepared as in Example 4 but containing 140 parts of pentaerythritol tetrathioglycollate, i.e., 0.5 allyl group equivalent per mercaptan group, and 0.25 part of hexamethylenetetramine; it was applied similarly, and then cured by heating for 1 hour at 80° and then 1 hour at 180°. The coating, which was not tacky, was unaffected by 20 rubs with an acetone-soaked swab.

EXAMPLE 6

A liquid composition was prepared by stirring 2,2-bis(3-(1-propenyl)-4-hydroxyphenyl)propane (100 parts), trimethylolpropane trithioglycollate (115 parts, i.e., 0.7 propenyl group equivalent per mercaptan group), benzophenone (4 parts), a polyglycidyl ether of a phenol-formaldehyde novolac as described in Example 2 (115 parts), and 2-phenylimidazole (2 parts).

Glasscloth (plain weave, weighing 200 g/m$^2$, with an epoxysilane finish) was impregnated at 40° with this composition and then it was exposed on both sides for 30 seconds, at a distance of 15 cm, to a 400 w high pressure metal halide arc lamp radiating predominantly in the 365 nm waveband. A tack-free prepreg was obtained.

Four 10-cm square pieces of the prepreg were stacked and heated at 170° for 1 hour under an applied pressure of 0.69 MN/m$^2$, allowing a dwell time of 3 minutes before applying maximum pressure. The laminate produced had a flexural strength of 226 MN/m$^2$ and contained 31.3% of glass.

EXAMPLE 7

A liquid composition was prepared by stirring 2,2-bis(3-(1-propenyl-4-hydroxyphenyl)propane (100 parts), trimethylolpropane trithioglycollate (81 parts, i.e., 1 propenyl group equivalent per mercaptan group), benzil dimethyl acetal (4 parts), a polyglycidyl ether of a phenol-formaldehyde novolac as described in Example 2 (115 parts), and 2-phenylimidazole (2 parts). This composition was coated at room temperature onto a polyamide carrier film, supported on siliconised paper, and converted into a tack-free film by irradiation under a 400 w metal halide quartz arc lamp at a distance of 15 cm for 30 seconds.

Overlap joints were made from the film adhesive so obtained as described in Example 2: their lap shear strength was 5.3 MN/m$^2$.

EXAMPLE 8

A surface coating was prepared by applying a mixture comprising 100 parts of 2,2-bis(3-(1-propenyl)-4-hydroxyphenyl)propane, 74 parts of pentaerythritol tetrathioglycollate, i.e., 1 propenyl group equivalent per mercaptan group, 5 parts of hexamethylenetetramine, and 4 parts of 2,2'-azobis(2-methylpropionitrile) as a layer 6 μm thick on degreased and pickled aluminium sheets and heating for 1 hour at 80° followed by 1 hour at 180°. The coating was tack-free and resisted more than 20 rubs with an acetone-soaked swab.

EXAMPLE 9

A mixture of 10 parts of 2,2-bis(3,5-diallyl-4-hydroxyphenyl)-propane, 28.7 parts of a tris(3-mercapto-2-hydroxypropyl) ether of a poly(oxypropylene) triol of average molecular weight 800 (i.e., 1 allyl group equivalent per mercaptan group), benzil dimethyl acetal (1 part), and hexamine (0.5 part) was applied as a coating 6 μm thick onto tinplate. The coating was irradiated with a 500 watt medium pressure mercury lamp at a distance of 20 cm, and it was tack-free on 45 seconds' exposure. The coating was resistant to 11 rubs with an acetone-soaked cotton wool swab; on being heated for 1 hour at 180° it was resistant to more than 20 such rubs.

EXAMPLE 10

A coating 6 μm thick was applied to tinplate, consisting of a mixture of 1,3- and 1,5-diallyl-2,4-dihydroxybenzene (10 parts), 52.6 parts of a mercaptan polysulphide of average formula

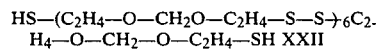

$$HS-(C_2H_4-O-CH_2O-C_2H_4-S-S)_6C_2H_4-O-CH_2-O-C_2H_4-SH \quad XXII$$

i.e., 1 allyl group equivalent per mercaptan group equivalent, 1 part of benzil dimethyl acetal, and 0.5 part of hexamine. The coating was irradiated with a 1200 w medium pressure mercury lamp at a distance of 22 cm; it became tack-free in 25 seconds, and resistant to 8 rubs with an acetone-soaked cotton wool swab. After being heated for 1 hour at 180° the coating withstood more than 20 such rubs.

EXAMPLE 11

The procedure of Example 10 was repeated, using 10 parts of bis(3-allyl-4-hydroxyphenyl) sulphide in place of the mixed diallylphenols and 33.5 parts of the polysulphide of formula XXII, i.e., 1 allyl group equivalent per mercaptan group. Similar results were achieved, irradiation for 35 seconds, however, being required before the coating was tack-free; it was resistant to 8 rubs with an acetone-soaked cotton wool swab. After being heated at 180° for 1 hour the coating withstood more than 20 such rubs.

EXAMPLE 12

Benzophenone (10 parts) was dissolved in a mixture of 2,2-bis(3-allyl-4-hydroxyphenyl)propane (100 parts) and pentaerythritol tetrathiolycollate (74 parts, i.e., 1 allyl group equivalent per mercaptan group). The liquid composition was applied as a coating 4 μm thick onto tinplate at room temperature and irradiated under a 500 w medium pressure mercury lamp at a distance of 20 cm. After 75 seconds the coating had become tack-free, and after 3½ minutes' irradiation it had become almost completely cured, being resistant to 12 rubs with a cotton wool swab soaked in acetone.

EXAMPLE 13

Benzil dimethyl acetal (10 parts) was dissolved in a mixture of 2,2-bis(3-allyl-4-hydroxyphenyl)propane (100 parts) and 179 parts of the tris(3-mercapto-2-hydroxypropyl) ether used in Example 9, i.e., 1 allyl group equivalent per mercaptan group. A coating was prepared as in Example 12 and irradiated with a 1200 w medium pressure mercury lamp at a distance of 22 cm. After 10 seconds' irradiation the coating was tack-free, and after 25 seconds' irradiation it was resistant to 20 rubs with a cotton wool swab soaked in acetone.

EXAMPLE 14

A surface coating was prepared by applying a mixture comprising 100 parts of 2,2-bis(3-allyl-4-hydroxyphenyl)propane, 74 parts of pentaerythritol tetrathioglycollate, i.e., 1 allyl group equivalent per mercaptan group, and 4 parts of 2,2'-azobis(2-methylpropionitrile) as a layer 4 μm thick on degreased and pickled aluminium sheets and heating for 1 hour at 80°. The coating was non-tacky, and withstood 4 rubs with an acetone-soaked swab.

EXAMPLE 15

Benzophenone (10 parts) was dissolved in a mixture of 2,2-bis(3-allyl-4-hydroxyphenyl)propane (100 parts) and dipentaerythritol hexakis(3-mercaptopropionate) (88.5 parts, i.e., 1 allyl group equivalent per mercaptan group). The liquid composition was applied as a coating 4 μm thick onto tinplate and irradiated under a 1200 w medium pressure mercury lamp at a distance of 22 cm. After 10 seconds the coating was tack-free and after 35 seconds it was resistant to 20 rubs with an acetone-soaked swab.

EXAMPLE 16

Benzophenone (10 parts) was dissolved in a mixture of 2,2-bis(3-(1-propenyl)-4-hydroxyphenyl)propane (100 parts) and pentaerythritol tetrathioglycollate (74 parts, i.e., 1 propenyl group equivalent per mercaptan group). The liquid composition was applied as a coating and irradiated as in Example 15. After 5 seconds the coating had become tack-free, and after 25 seconds' irradiation it was resistant to 16 rubs with a cotton wool swab soaked in acetone.

EXAMPLE 17

A mixture was prepared as in Example 13, using, however 100 parts of 2,2-bis(3-(1-propenyl)-4-hydroxyphenyl)propane, i.e., 1 propenyl group equivalent per mercaptan group. A coating was prepared as in Example 12, applied at 40°, and irradiated as in Example 12. After 1 minute's irradiation, a flexible, tack-free coating was obtained. After 3½ minutes' irradiation the coating was resistant to 20 rubs with an acetone-soaked swab.

EXAMPLE 18

A surface coating was prepared by applying a mixture comprising 100 parts of 2,2-bis(3-(1-propenyl)-4-hydroxyphenyl)propane, 74 parts of pentaerythritol tetrathioglycollate, i.e., 1 propenyl group equivalent per mercaptan group, and 4 parts of 2,2'-azobis(2-methylpropionitrile) as a layer 6 μm thick on degreased and pickled aluminium sheets and heating for 1 hour at 80°. The coating was tack-free and resisted 10 rubs with an acetone-soaked swab.

EXAMPLE 19

Benzophenone (10 parts) was dissolved in a mixture of 2,2-bis(3-allyl-4-hydroxyphenyl)propane (100 parts) and pentaerythritol tetrathioglycollate (140 parts, i.e., 0.5 allyl group equivalent per mercaptan group). The liquid composition was applied as a coating 6 μm thick onto tin foil at room temperature and irradiated as in Example 12. After 90 seconds the coating had become tack-free and after 5 minutes' irradiation it had become almost completely cured, being resistant to 18 rubs with a cotton wool swab soaked in acetone.

EXAMPLE 20

A composition was made as in Example 13 except that 107 parts of the mercaptan was used, i.e., 1.7 allyl group equivalents per mercaptan group. A coating was prepared as in Example 14, and after 3½ minutes' irradiation a flexible, tack-free coating had been obtained.

EXAMPLE 21

The procedure of Example 14 was repeated, using, however, 140 parts of pentaerythritol tetrathioglycollate, i.e., 0.4 allyl group equivalent per mercaptan group. The coating was tacky, but withstood more than 20 rubs with an acetone-soaked swab.

EXAMPLE 22

A mixture of 2,2-bis(3,5-diallyl-4-hydroxyphenyl)propane (10 parts), trimethylolpropane trithioglycollate (12.9 parts, i.e., 1.0 allyl group equivalent per mercaptan group), and benzil dimethyl acetal (0.1 part) was applied as a layer 6 μm thick onto tin foil and irradiated under a 500 w medium pressure mercury lamp at a distance of 20 cm for 40 seconds, to give a tack-free coating.

What is claimed is:

1. A polymerizable composition comprising:
    (a) a polyhydric phenol which contains in the same molecule both at least two phenolic hydroxyl groups and at least two groups selected from allyl, methallyl, and 1-propenyl groups;
    (b) a mercaptan which contains at least two mercaptan groups per molecule, such that the polyhydric phenol provides a total of 0.4 to 2.4 equivalents selected from allyl, methallyl, and 1-propenyl group per equivalent of mercaptan group; and
    (c) an effective amount of a heat-activated crosslinking agent for phenol-aldehyde novolac resins selected from the group consisting of epoxide resins and sources of formaldehyde.

2. A composition of claim 1, in which each group chosen from allyl, methallyl, and 1-propenyl groups of the polyhydric phenol is attached to a carbon atom which forms part of an aromatic nucleus.

3. A composition of claim 1, in which each group chosen from allyl, methallyl, and 1-propenyl groups of the polyhydric phenol is attached to an oxygen atom which is directly attached to a carbon atom which forms part of an aromatic nucleus.

4. A composition of claim 1, in which the polyhydric phenol is partially etherified with at least two groups chosen from allyl, methallyl, and 1-propenyl groups.

5. A composition of claim 1, wherein the mercaptan is an ester of a monomercaptan-carboxylic acid with a polyhydric alcohol or of a monomercaptan monohydric alcohol with a polycarboxylic acid.

6. A composition of claim 1 wherein the mercaptan is of the formula XIII

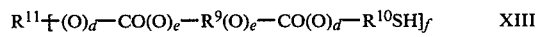

where
d and e each represent zero or 1 but are not the same,
f is an integer of from 1 to 6,
$R^9$ represents a divalent radical, linked through a carbon atom or carbon atoms thereof to the indicated —O— or —CO— units,
$R^{10}$ represents a divalent organic radical, linked through a carbon atom or carbon atoms thereof to the indicated -SH group and —O— or —CO— unit, and
$R^{11}$ represents an organic radical, which must contain at least one -SH group when f is 1, linked through a carbon atom or carbon atoms thereof to the indicated —O— or —CO— unit.

7. A composition of claim 1 wherein the mercaptan is of the formula XIV

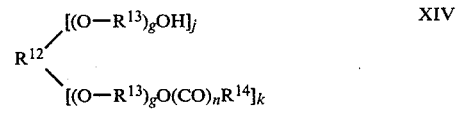

where
$R^{12}$ represents the radical of a polyhydric alcohol after removal of (j+k) alcoholic hydroxyl groups,
each $R^{13}$ denotes an alkylene group containing a chain of at least 2 and at most 6 carbon atoms between consecutive oxygen atoms,
$R^{14}$ represents an aliphatic radical of 1 to 6 carbon atoms, containing at least one mercaptan group,
g is a positive integer,
h is zero or 1, j is zero or a positive integer such that (j+k) is at most 6, and k is an integer of from 2 to 6.

8. A composition of claim 1 wherein the mercaptan is of the formula XVII

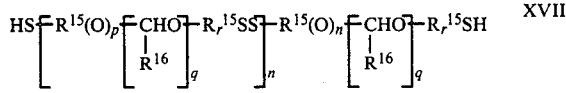

where
each $R^{15}$ denotes an alkylene hydrocarbon group containing from 2 to 4 carbon atoms,
$R^{16}$ denotes —H, —CH$_3$, or —C$_2$H$_5$,
n is integer which has an average value of at least 1, and either p is zero, in which case q and r are each also zero,
or p or 1, in which case q is zero or 1 and r is 1.

9. A composition of claim 1 wherein the mercaptan is of the formula XVIII

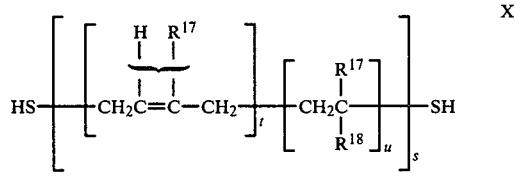

where
each $R^{17}$ represents —H or —CH$_3$,
$R^{18}$ represents —CN, —COOH, —CONH$_2$, —COOR$^{19}$, —C$_6$H$_5$, or —OCOR$^{19}$,
where $R^{19}$ is an alkyl group of one to eight carbon atoms,
t is an integer of at least one,
u is zero or a positive integer, and
s is an integer of more than one.

10. A composition of claim 1 wherein the mercaptan is of the formula XX

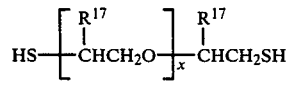

where each $R^{17}$ represents —H or —CH$_3$ and
x is an integer of from 1 to 4.

11. A composition of claim 1, wherein the mercaptan is of the formula XXI

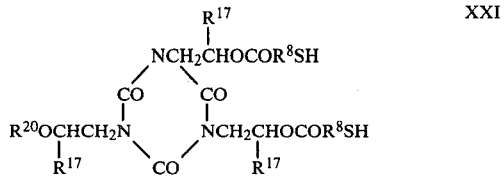

each $R^8$ denotes —CH$_2$—, (CH$_2$)$_2$—, or —CH(CH$_3$)—,
each $R^{17}$ denotes —H or —CH$_3$, and
$R^{20}$ denotes —H or a group —COR$^8$SH.

12. A composition of claim 1, which also contains a photoinitiator.

13. A composition of claim 1, which also contains a free-radical catalyst.

14. A composition of claim 1, wherein the polyhydric phenol is 2,2-bis(3-allyl-4-hydroxylphenyl) propane and the mercaptan is pentaerythritol tetrathioglycollate.

15. A composition of claim 1, wherein the polyhydric phenol is 2,2-bis(3-allyl-4-hydroxyphenyl) propane and the mercaptan is the tris (3-mercapto-2-hydroxypropyl) ether of a polyoxypropylenetriol of an average molecular weight of 800.

16. A polymerizable composition comprising:
(f) a monohydric phenol which contains in the same molecule both one phenolic hydroxyl group and at least two groups selected from allyl, methallyl, and 1-propenyl groups;
(g) a mercaptan which contains at least two mercaptan groups per molecule, such that the monohydric phenol provides a total of 0.4 to 2.4 equivalents selected from allyl, methallyl and 1-propenyl groups per equivalent of mercaptan group; and
(h) an effective amount of a heat-activated crosslinking agent for phenol-aldehyde novolac resins selected from the group consisting of epoxide resins and sources of formaldehyde.

17. A composition of claim 16, wherein the monohydric phenol is a phenol substituted in the aromatic nucleus or nuclei by at least two groups selected from allyl, methallyl, and 1-propenyl groups.

* * * * *